United States Patent [19]

McDavid

[11] Patent Number: 4,665,295
[45] Date of Patent: May 12, 1987

[54] LASER MAKE-LINK PROGRAMMING OF SEMICONDUCTOR DEVICES

[75] Inventor: James M. McDavid, Dallas, Tex.

[73] Assignee: Texas Instruments Incorporated, Dallas, Tex.

[21] Appl. No.: 636,936

[22] Filed: Aug. 2, 1984

[51] Int. Cl.⁴ .................. B23K 26/00; H01L 21/46
[52] U.S. Cl. .................. 219/121 LM; 219/121 LE; 219/121 LF; 219/121 LJ; 219/121 LH; 427/53.1; 148/1.5; 29/576 B; 29/591
[58] Field of Search .................. 219/121 LJ, 121 LH, 219/121 LM, 121 LE, 121 LF, 121 EM, 121 ES; 427/53.1; 29/576 B, 577, 590, 589, 591; 148/DIG. 91, DIG. 93, 1.5; 357/91

[56] References Cited

U.S. PATENT DOCUMENTS

| | | | |
|---|---|---|---|
| 4,240,094 | 12/1980 | Mader | 219/121 LJ |
| 4,259,367 | 3/1981 | Dougherty, Jr. | 219/121 LJ |
| 4,545,111 | 10/1985 | Johnson | 148/1.5 |

OTHER PUBLICATIONS

IBM Disclosure Bulletin, vol. 21, No. 8, 1/1979, "Laser Programmable Variable-Valve Resistor".
IBM Disclosure Bulletin, vol. 21, No. 9, 2/1979, Laser Engineering Capability for Microcircuit".

*Primary Examiner*—M. H. Paschall
*Attorney, Agent, or Firm*—Richard A. Bachand; N. Rhys Merrett; Melvin Sharp

[57] ABSTRACT

A semiconductor device is programmed by a laser beam which causes an electrical short between two conductors on a silicon substrate, as by melting an insulator between the conductors and fusing or shorting the conductors. The conductors may be first and second levels of polycrystalline silicon in a standard double-level poly process, and the insulator is thermal silicon oxide. The laser beam is focused on an area which is shielded from the silicon substrate by the first-level conductor, so heating and disruption of the substrate or underlying circuit structure is minimized.

13 Claims, 5 Drawing Figures

LASER MAKE-LINK PROGRAMMING OF SEMICONDUCTOR DEVICES

BACKGROUND OF THE INVENTION

This invention relates to semiconductor devices, and more particularly to laser programming of such devices.

Various methods have been employed for selectively programming semiconductor devices after manufacture is essentially complete. For example, in the manufacture of very high density dynamic RAMs, such as the 1-Megabit device, it has become an economic necessity to utilize redundancy; the DRAM devices are programmed after testing in order to bypass faulty parts of the memory. In one commonly used method, a polysilicon or other conductive strip on the surface of the chip is melted through by a laser beam at the desired positions; this is known as laser break-link programming. In bipolar PROMs, conductors are melted at narrow high resistance areas by electrical pulses. In some devices of this type an oxide is broken down by a laser beam or by over-voltage, shorting together two conductors and providing make-link instead of break-link programming. The heating effect of a laser beam has also been used to diffuse impurity into a silicon or polysilicon area to change its conductivity providing a programming method. The effect of laser heating for altering the dopant distribution in silicon devices has been reported.

Prior devices of this type have required excess space on the chip for the link stucture, or for the circuits needed to program the links. The laser-blown fuses have created problems due to the craters produced in the surface of the chip by the laser beam, or splashing of metal or conductive material to other parts of the circuit.

It is the principal object of this invention to provide an improved method of programming of semiconductor devices, particularly by laser beam make-link programmable elements. Another object is to provide a laser programming method which requires less space on the semiconductor substrate for implementation. A further object is to provide a laser programming method which is less disruptive of the surrounding structure and materials, and/or which leaves a minimum of residue. Other objects include lower dwell time needed for the laser beam (thus faster programming) and lower power (thus less heating).

SUMMARY OF THE INVENTION

In accordance with one embodiment of the invention, a semiconductor device is programmed by a laser beam which causes an electrical short between two conductors on a silicon substate, as by melting an insulator between the conductors and fusing or shorting the conductors. The conductors may be first and second levels of polycrystalline silicon in a standard double-level poly process, and the insulator is thermal silicon oxide. The laser beam is focused on an area which is shielded from the silicon substrate by the first-level conductor, so heating and disruption of the substrate or underlying circuit structure is minimized.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

BRIEF DESCRIPTION OF SPECIFIC EMBODIMENT

Figure 1:
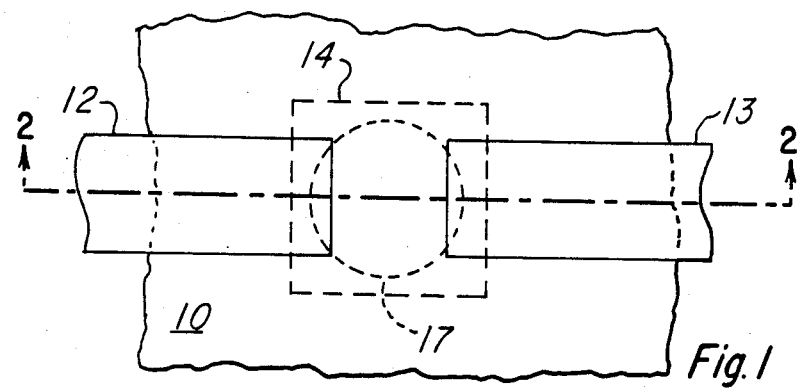
FIG. 1 is a plan view, greatly enlarged, of a part of a semiconductor chip having the make-link laser beam programmable structure of the invention.
Figure 2:
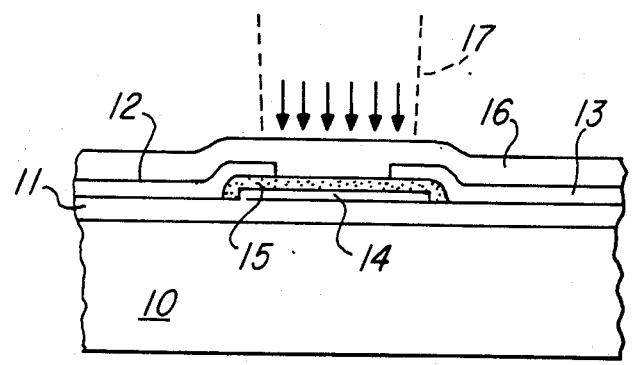
FIG. 2 is an elevation view in section of the device of FIG. 1, taken along the line 2—2 in FIG. 1.
Figure 3:
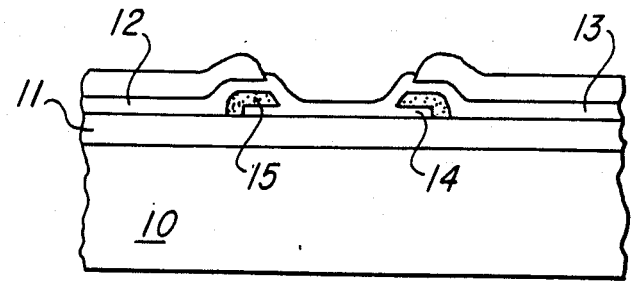
FIG. 3 is the same as FIG. 2, after the make-link programming of the invention.

Referring to FIGS. 1 and 2, one type of laser melt-link fuse for an integrated circuit is illustrated according to the invention. The integrated circuit is formed at a face of a semiconductor substrate 10 and typically includes a large number of MOS field-effect transistors such as shown in U.S. Pat. Nos. 4,055,444 or 4,388,121 issued to G. R. Mohan Rao, assigned to Texas Instruments. An insulator such as field oxide 11 surrounds the transistors on the face of the substrate 10, and this field oxide would underlie the fuse structure in a typical embodiment. The fuse includes conductor strips 12 and 13 separated by a gap, and a conductive pad 14 beneath the gap. A thin oxide coating 15 separates the pad 14 from the strips 12 and 13. A relatively thick layer 16 of protective overcoat would usually be applied on top of all of the elements of the integrated circuit on the face of the substrate. This layer 16 would be silicon dioxide or phosphosilicate glass. A laser beam 17 is impinged upon the fuse structure to cause the two conductors 12 and 13 to be electrically connected. The laser beam functions to first erode away the insulator layer 16 in the spot where it strikes the face, and then to melt the edges of the strips 12 and 13 and the material of the pad 14, to leave a structure as seen in FIG. 3 where the melted conductive material from the strips and pad will splash up the sides of a hole created in the oxide 15, electrically shorting the conductors 12 and 13 through the pad 14. The laser beam should not penetrate the material of the pad 14, but if it does the circuit is still complete around the edges of the pad; the beam 17 should be smaller than the pad 14, so the pad shields the substrate.

In one embodiment, the pad 14 is first-level polycrystalline silicon in a standard double-level polysilicon process as disclosed in U.S. Pat. No. 4,388,121 mentioned above; the strips 12 and 13 are second-level polysilicon, and the oxide 15 is interlevel thermal oxide of about 2000 Å thickness. The pad 14 is not nearly as transparent to the laser beam 17 as the silicon dioxide layers are, and so the penetration into the silicon of heating by the beam is minimized or eliminated, thus reducing the damage to the active FET's in the face of the substrate beneath or near the fuse structure.

As an alternative, a small area of the insulator layer 16 corresponding in size to the laser beam 17 may be removed by a photolithographic mask and etch step prior to the application of the laser beam for programming. This decreases the dwell time needed to complete the make-link, and this decreases heating and disruption. However, the disadvantage of this alternative is that the link areas are left unprotected by the final insulator coating.

Figure 4:
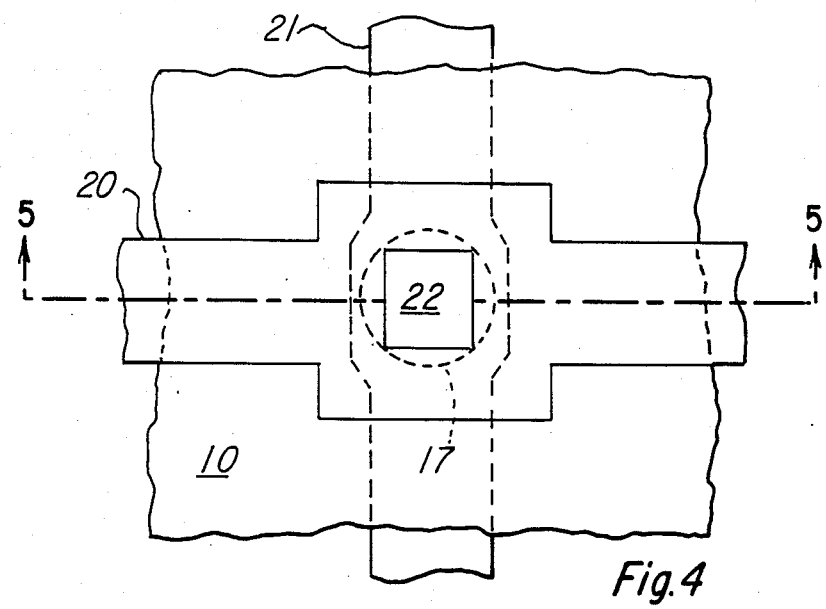
FIG. 4 is a plan view, greatly enlarged, of a part of a semiconductor chip having the make-link laser beam programmable structure according to another embodiment of the invention.
Figure 5:
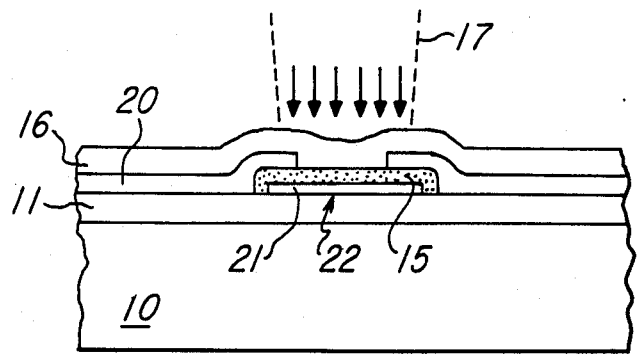
FIG. 5 is an elevation view in section of the device of FIG. 4, taken along the line 5—5 in FIG. 4.

Another embodiment of the fuse of the invention is shown in FIGS. 4 and 5. In this example an upper conductor 20 is selectively connected to a lower conductor strip 21 at a programming area 22. A hole is left in the upper conductor 20 at the programming area because the conductor 20 (second-level polysilicon) is semi-opaque to the laser beam 17; the hole allows the laser beam to penetrate and melt the oxide 15. As noted above, a hole may be etched in the protective overcoating 16 before programming, to reduce dwell time. This embodiment of FIGS. 4 and 5 provides even more protection for the underlying silicon because the larger area of the top conductor blocks the beam except at the hole. The materials and process for making this structure are the same as that for FIGS. 1–3, and are set forth in the U.S. Pat. Nos. 4,055,444 and 4,388,121, incorporated herein by reference.

An additional advantage of the shielding provided by the melt-link fuse structure of the invention is the reduction in laser-beam-generated carriers in the silicon substrate 10. These fuse structures are most often used for programming the addresses of faulty rows or columns into a memory device while it is still in slice form, at a multi-probe test station. Several hundred devices are formed at the same time on a 4" or 6" silicon slice, using the processes of the above-mentioned Patents; each device contains perhaps 256K or 1-Meg memory bits. The test machine indexes the multi-probe to one device, cycles through the tests to locate faulty cells and/or faulty rows or columns, stores this data, indexes the multiprobe to begin testing another device then based on the stored data it later indexes the laser beam to program into the previously-tested device the addresses of faulty locations, while continuing to test other devices. Thus, if the laser beam causes the generation of large quantities of carriers in the silicon, it can disturb the tests. It would unduly lengthen the testing and programing period if the laser beam had to be turned off whenever a test was in progress.

A laser is selected of wavelength which is absorbed by the materials of the make-link structure. For example, an Argon laser with a beam size of 6 microns will short two polysilicon layers 20 and 21 of about 3000 to 5,000 Å thickness, separated by 2000 Å silicon dioxide, layer 15, using multiple pulses of ten to 100 nanoseconds.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A laser beam programmable semiconductor device, comprising:
    an upper electrically conductive strip having an opening therein defining a laser programmable area;
    a lower electrically conductive layer a portion of which underlies the opening; and
    an electrical insulating layer separating said strip and lower conductive layer being sufficiently thin so that upon being impinged by a laser beam the insulating layer below the opening disintegrates and the laser beam melts the upper conductive strip and lower conductive layer so as to fuse the two together; and
    wherein the opening in said upper strip is sufficiently large such that a substantial fraction of the laser beam passes through the opening and a portion thereof irradiates and melts edges of the conductive strip.

2. A device according to claim 1, wherein said upper conductive strip and lower conductive layer are polycrystalline silicon.

3. A device according to claim 1, wherein said electrical insulating layer is silicon oxide.

4. A device according to claim 1, wherein said upper conductive strip is a strip extending along a face of a semiconductor body and the opening therein is substantially smaller than the width of said strip.

5. A device according to claim 1, wherein said upper conductive strip is a strip extending along a face of a semiconductor body and the opening therein is a gap dividing said strip into two parts and said lower conductive layer is wider than said strip in a region of said laser programmable area.

6. A method of making a semiconductor device, comprising the steps of:
    forming an upper electrically conductive strip having an opening therein defining a beam programmable area which is a substantial proportion of the cross-sectional area of a beam, a lower electrically conductive layer with a portion thereof underlying the upper conductive strip and an electrically insulating layer separating said strip and lower conductive layer sufficiently thin so as to be capable of disintegrating upon being impinged by the beam; and
    irradiating said programming area of the face with the beam impinging upon the conductive strip and layer and said insulating layer so as to create a conductive path between said upper strip and lower layer.

7. A method according to claim 6, wherein said beam is a laser beam.

8. A method according to claim 6, wherein the width of the opening is less than the width of said beam so that the portion of said upper conductive strip around the opening shields said body from said beam.

9. A method according to claim 6, wherein the width of the opening is less than that of said underlying lower electrically conductive layer.

10. A method according to claim 8, wherein said lower conductive layer and said upper conductive strip are polycrystalline silicon.

11. A method according to claim 9, wherein said lower conductive layer and upper conductive strip are polycrystalline silicon.

12. A method according to claim 8, wherein said insulating layer is silicon dioxide which is eroded away in said programming area by said beam.

13. A method according to claim 9, wherein said insulating layer is silicon dioxide which is eroded away in said programming area by said beam.

* * * * *